(12) United States Patent
Jelinger

(10) Patent No.: US 6,865,087 B2
(45) Date of Patent: Mar. 8, 2005

(54) WIRE MANAGEMENT SYSTEM

(75) Inventor: Conrad A. H. Jelinger, Toledo, OH (US)

(73) Assignee: Unitrend, Inc., Toledo, OH (US)

( * ) Notice: Subject to any disclaimer, the term of this patent is extended or adjusted under 35 U.S.C. 154(b) by 0 days.

(21) Appl. No.: 10/429,624

(22) Filed: May 5, 2003

(65) Prior Publication Data

US 2004/0150978 A1 Aug. 5, 2004

Related U.S. Application Data

(63) Continuation-in-part of application No. 10/356,942, filed on Feb. 3, 2003, now Pat. No. 6,711,031.

(51) Int. Cl.[7] .............................. H05K 5/00; H05K 5/04; H05K 5/06
(52) U.S. Cl. ...................... 361/756; 361/801; 361/826; 361/827; 174/138 G; 174/72 A
(58) Field of Search ................................ 361/756, 810, 361/826, 827, 807, 785; 174/52.5, 138 D, 72 A; 439/719; 248/59

(56) References Cited

U.S. PATENT DOCUMENTS

| | | | |
|---|---|---|---|
| 3,809,799 A | | 5/1974 | Taylor |
| 3,960,425 A | | 6/1976 | Kirk, Jr. et al. |
| 4,379,536 A | * | 4/1983 | Mizuno et al. ............... 248/73 |
| 4,771,743 A | | 9/1988 | McDowell |
| 5,215,297 A | | 6/1993 | Sato et al. |
| 5,478,060 A | | 12/1995 | Sugimoto et al. |
| 5,490,664 A | | 2/1996 | Justus et al. |
| 5,694,678 A | | 12/1997 | Karasik |
| 5,940,962 A | | 8/1999 | Shima et al. |
| 6,124,548 A | * | 9/2000 | Suzuki et al. ............. 174/72 A |
| 6,398,149 B1 | | 6/2002 | Hines et al. |

FOREIGN PATENT DOCUMENTS

EP 0625785 A2 5/1994

OTHER PUBLICATIONS

PCT/US2004/002368 International Search Report dated Jun. 24, 2004.

* cited by examiner

*Primary Examiner*—Randy W. Gibson
*Assistant Examiner*—Hung S. Bui
(74) *Attorney, Agent, or Firm*—Honigman Miller Schwartz and Cohn LLP

(57) ABSTRACT

A management system for wiring and/or cabling is disclosed. The wire management system comprises a mounting stud and an integral cable guide assembly. The cable guide assembly may include a base portion and an upper portion with at least two guide members that may be removably mounted to the mounting stud. The at least two guide members of the cable guide assembly orientates the wiring and/or cabling in a generally vertical direction with respect to a heat emitting device so as to minimize the surface area of the wiring and/or cabling that is exposed to a heat emitting device, thereby minimizing heat buildup within an enclosure. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

13 Claims, 10 Drawing Sheets

WIRE MANAGEMENT SYSTEM

CROSS-NOTING TO RELATED APPLICATION

This application is a continuation-in-part of U.S. application Ser. No. 10/356,942, filed Feb. 3, 2003, now U.S. Pat. No. 6,711,031.

BACKGROUND OF THE INVENTION

1. Field of the Invention

This invention is related to managing wires and/or cabling, and in particular to managing wires and/or cabling internally or externally in relation to an electronic system.

2. Description of the Related Art

In some electronic systems, such as a computer system with an enclosure, wires and/or cabling are run randomly from one connection point to another. The wires and/or cabling may lie on or close to one or more heat-emitting devices within the computer system enclosure, thereby trapping heat from these devices and causing excessive heat buildup within the computer system. This is especially true of ribbon cabling having a large surface area that can entirely cover the heat-emitting device.

SUMMARY OF THE INVENTION

The inventor of the present invention has recognized these and other problems and has developed a wire management system that orientates the wires and/or cabling so as to minimize the surface area of the wires and/or cabling that are exposed to the heat emitting device. As a result, the heat emitted from the device can dissipate in a more efficient fashion, thereby minimizing heat buildup within the enclosure. Because heat buildup is a major contributor to electronic component failure, the present invention greatly improves life and reliability of the heat-emitting devices.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
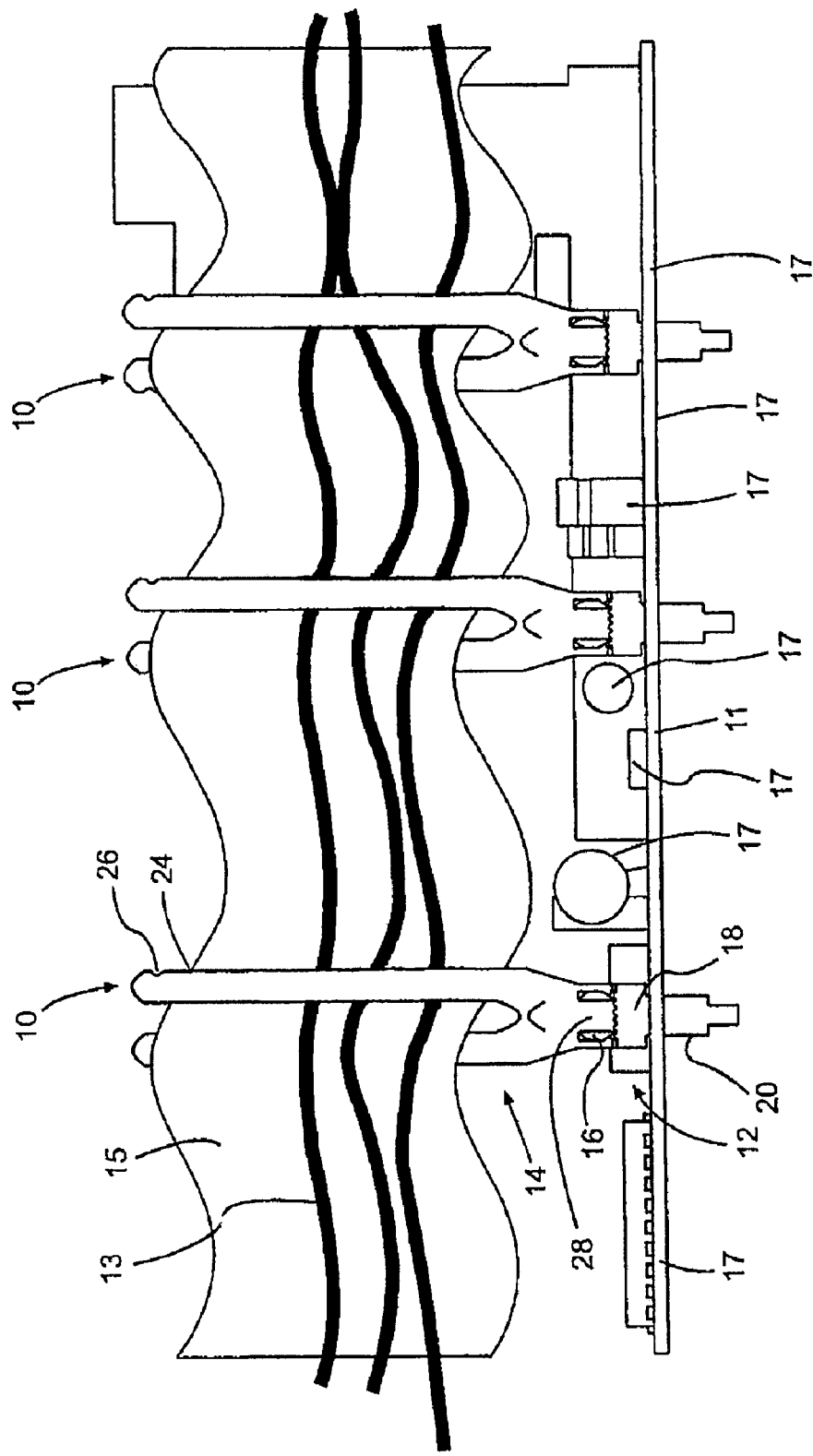
FIG. 1 is a perspective view of one embodiment of the wire management system cooperating with a wafer board.
Figure 2:
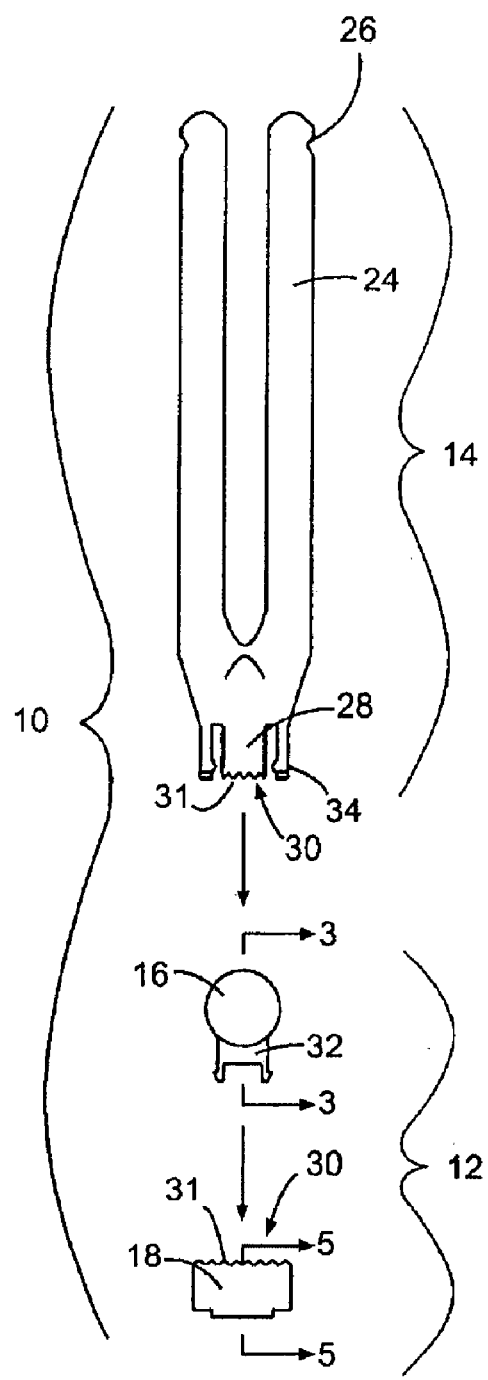
FIG. 2 is a side view of the wire management system of FIG. 1.
Figure 3:
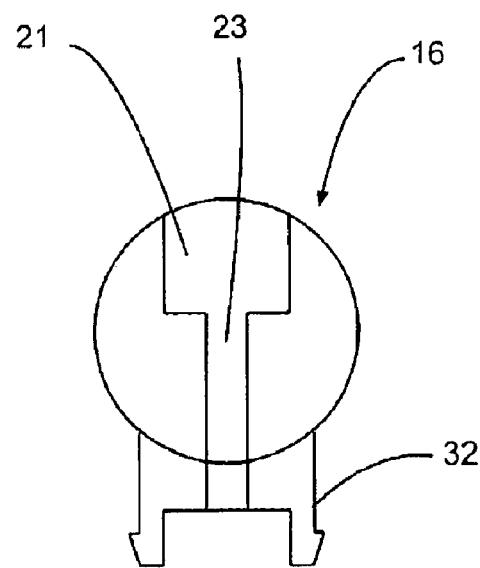
FIG. 3 is a cross-sectional view of a base pivot of the wire management system of FIG. 2.
Figure 4:
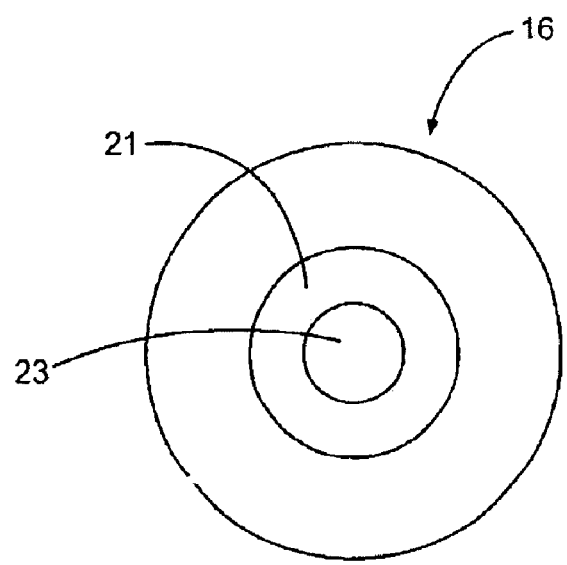
FIG. 4 is a top view of the base pivot of FIG. 3.

Referring now to FIGS. 1 and 2, a wire management system (WMS) is shown generally at 10. The WMS 10 comprises a first portion 12 and a second portion 14. The first portion 12 comprises a base pivot 16, a base socket 18, a mounting stud 20 and a mounting bolt 22. The first portion 12 provides a means for fastening the WMS 10 to an electrical component 11, such as a printed circuit board (PCB). The base socket 18 may be fastened anywhere to the electrical component 11, such as for example, a printed circuit board (PCB 11). The second portion 14 comprises a cable guide assembly defined by at least two non-conductive guide members 24 with locking notches 26 and a base member 28. The second portion 14 provides a means for suspending wires 13 and/or cabling 15 to minimize the heat build-up from a plurality of heat-emitting devices 17, such as the various components of the PCB 11. The WMS 10 is preferably made of non-conductive material, such as plastic, or the like.

As best shown in FIGS. 2–6, the base pivot 16 further comprises one or more tangs 32 for removably mounting the base pivot 16 to the base socket 18 at tang receiving apertures 33. Similarly, the base member 28 may also include one or more tangs 34 for removably mounting the first portion 14 to the base socket 18 of the second portion 12. Thus, the second portion 14 can be easily snapped to the first portion 12 by receiving the base pivot 16 within the base member 28, as shown in FIG. 2. The design of the WMS 10 permits separation of the second portion 14 from the first portion 12 in the event that excessive forces are applied to the guide members 24 to reduce damage to the WMS 10, the PCB 11, or any of the heat-emitting devices 17.

Figure 5:
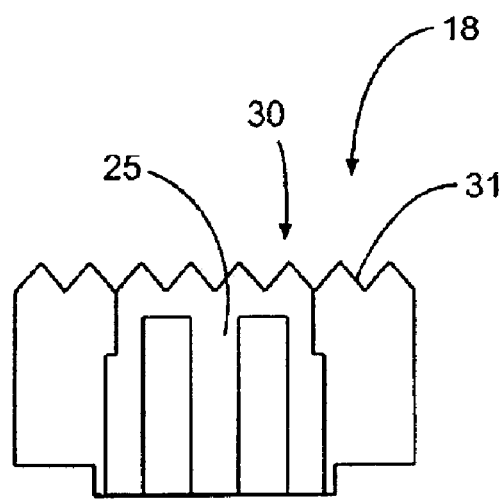
FIG. 5 is a cross-sectional view of a base socket of the wire management system of FIG. 2.
Figure 6:
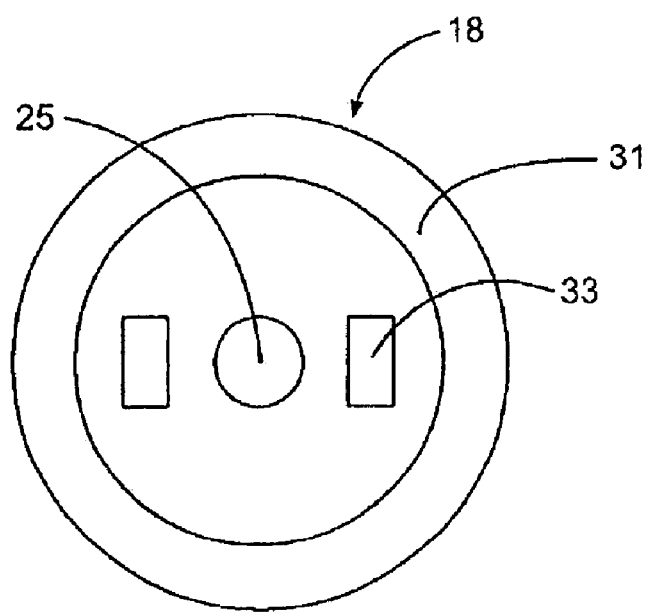
FIG. 6 is a top view of the base socket of FIG. 5.

As seen in FIGS. 2 and 5–6, the base socket 18 and the guide members 24 include cooperating mating surfaces 30 defined by a plurality of interlocking teeth 31. The cooperating mating surfaces 30 permit rotatable positioning of the at least two guide members 24 relative to the base socket 18. One aspect of the invention is that the guide members 24 permit orientation of the wires 13 and/or cabling 15 in a generally vertical direction with respect to the heat emitting devices 17. Thus, minimization of the surface area of the wiring 13 and/or cabling 15 exposed to the heat emitting devices 17 may be achieved. For example, ribbon cabling 15 having a large surface area may be generally vertically oriented, thereby reducing the surface area covering the heat-emitting devices 17 and minimizing heat build-up within the computer housing (not shown).

Figures 7A, 7B:
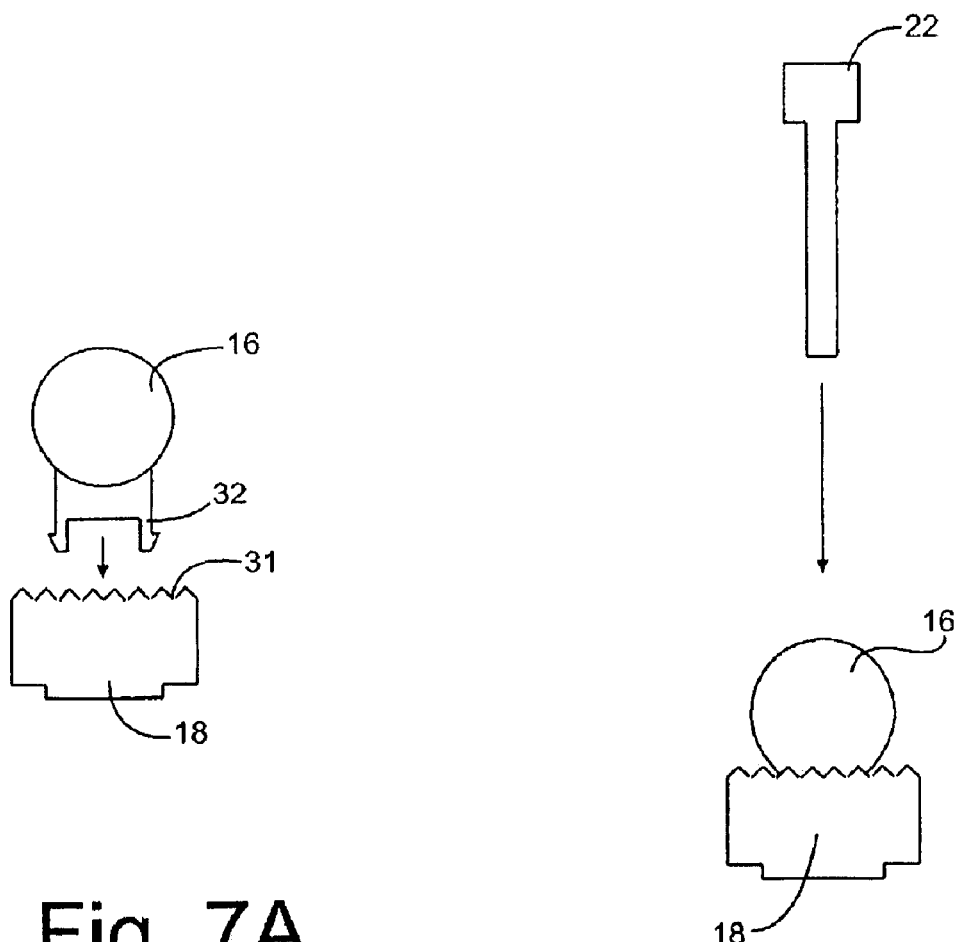
FIGS. 7A–7E is a view showing the steps for assembling the wire management system of FIG. 1.
Figure 7C:
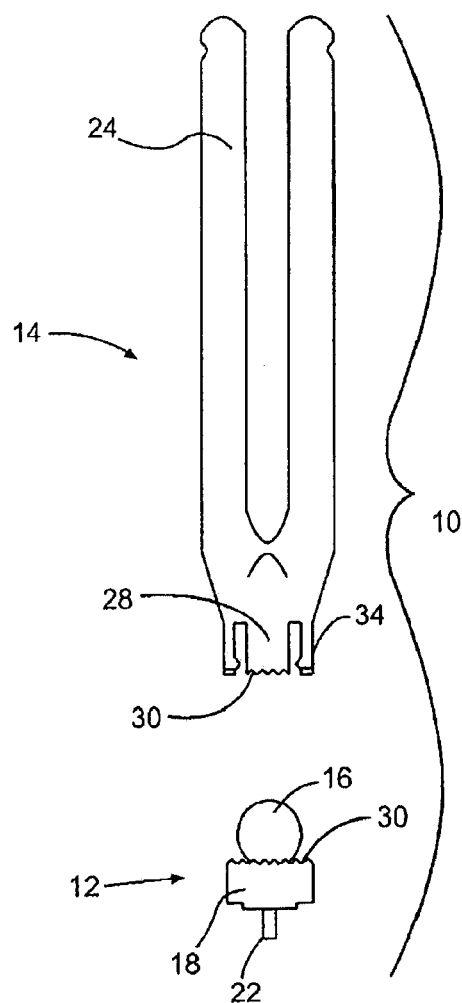
Figure 7D:
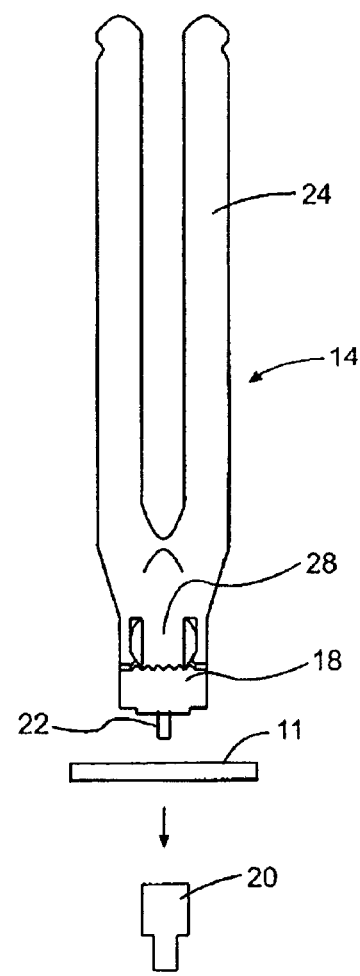
Figure 7E:
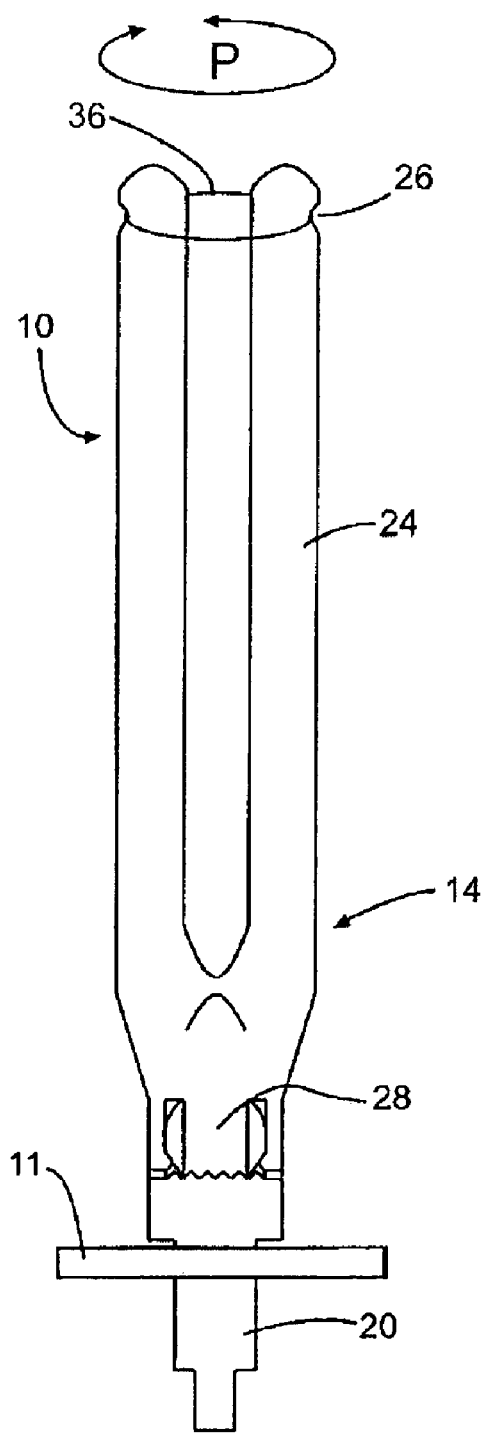

Referring now to FIGS. 7A–7E, an assembly process for mounting the WMS 10 on the PCB 11 will now be described. As shown in FIG. 7A, the tangs 32 of the base pivot 16 are first positioned over the tang receiving apertures 33 and inserted into the base socket 18. Then, a mounting bolt 22 is positioned over a central bolt-head-receiving portion or recess 21 in the base pivot 16 and bolt apertures 23, 25 in the base pivot 16 and base socket 18, respectively, as shown in FIG. 7B. Once the mounting bolt 22 is positioned as described above, the mounting bolt 22 is inserted through the bolt apertures 23, 25 of the base pivot 16 and base socket 18, respectively. Next, the base member 28 of the guide members 24 is positioned over and received by the base pivot 16, as shown in FIG. 7C. Then, the PCB 11 is intermediately located between the base socket 18 and a mounting stud 20, wherein the mounting stud 20 is positioned in a desirable location under the PCB 11, as shown in FIG. 7D. Finally, the mounting bolt 22 is inserted through the PCB 11 and into the mounting stud 20 can be tightened to positively secure the WMS 10 to the PCB 11. Once the WMS 10 is assembled on the PCB 11, the guide members 24 may be rotatably positioned by loosening the mounting stud 20 sufficiently to allow the WMS 10 to be rotated about the PCB 11, as indicated by doubled-headed arrow, P. Once the wires 13 and/or cabling 15 is received between the guide members 24, a means 36 for preventing the wires 13 and/or cabling 15, such as a nylon hoop, a rubber band, or the like, may be placed within the locking notches 26 to prevent the wires 13 and/or cabling 15 from being received between the guide members 24.

Figures 8A, 8B, 8C:
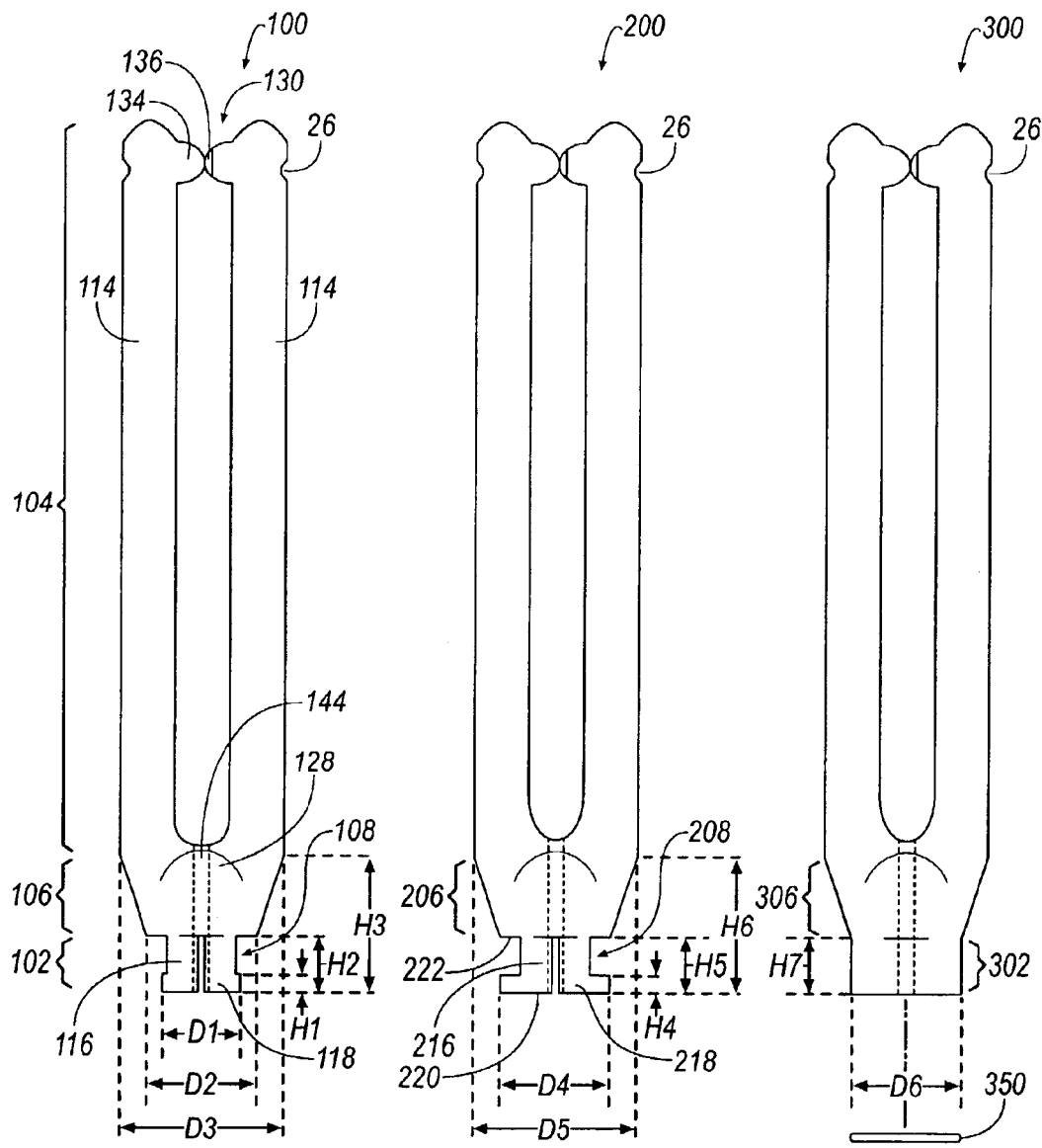
FIG. 8A is a side view of a second embodiment of the wire management system.
FIG. 8B is a side view of a third embodiment of the wire management system.
FIG. 8C is a side view of a forth embodiment of the wire management system.
Figures 9A, 9B, 9C:
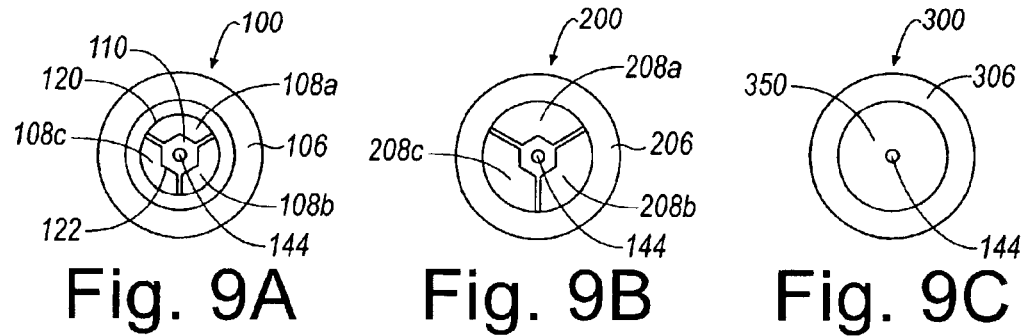
FIG. 9A is a bottom view of the wire management system of FIG. 8A.
FIG. 9B is a bottom view of the wire management system of FIG. 8B.
FIG. 9C is a bottom view of the wire management system of FIG. 8C.
Figure 11A:
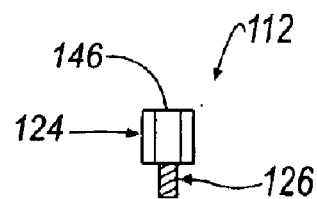
FIG. 11A is a side view of a mounting stud that permits attachment and adjustment of the wire management system in FIGS. 8A–8C.
Figure 11B:
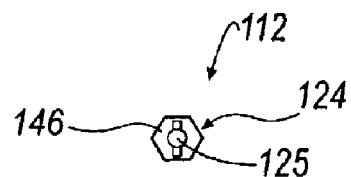
FIG. 11B is a top view of the mounting stud of FIG. 11A.

Referring now to FIGS. 8A and 9A, another embodiment of the WMS is shown generally at 100. The WMS 100 is preferably an integral unit comprising at least a base portion 102, an upper portion 104, and a beveled portion 106 intermediately located between the base portion 102 and the upper portion 104. The base portion 102 is further defined to include a relief cut 108 with break-away portions 108a–108c (FIG. 9A) that defines a cavity 110 for receiving a mounting stud 112 (FIGS. 11A and 11B). Similar to the functionality of the first portion 12 as described above for the WMS 10, the base portion 102 and mounting stud 112 provides a means for fastening the WMS 100 to an electrical component, such as the PCB 11 (FIGS. 1 and 12B–12E).

In this embodiment of the invention, the WMS 100 is preferably a one-piece unit made of non-conductive material, such as plastic, or the like, that permits flexible attachment, detachment, and adjustable repositioning of the WMS 100 about the mounting stud 112, as well as providing an integral separation capability of the WMS 100 from the mounting stud 112 in the event that excessive forces are applied to a cable guide assembly defined by at least two non-conductive guide members 114. Accordingly, once the mounting stud 112 is attached to the PCB 11 (FIGS. 12B and 12C), the guide members 114 may be selectively positioned, if desired, by perpendicularly lifting and detaching the WMS 100 from the mounting stud 112, pivoting the WMS 100 to a desirable position, and placing the WMS 100 over the mounting stud 112 (i.e. proceeding, in reverse order, from FIG. 12E to FIG. 12D, and then back to FIG. 12E).

Referring back to FIG. 8A, the relief cut 108 may be further defined to include at a throat portion 116 and a neck portion 118 and may be considered to be a pre-weakened area or break point that provides support for effectively guiding wires 13 and/or cabling 15 (FIG. 1), while also permitting the WMS 100 to snap off or break from the PCB 11 at the relief cut 108 during an undesirable loading event. In general, the base portion 102, the beveled portion 106 and the relief cut 108 define a first diameter, D1, a second diameter, D2, a third diameter, D3, a first height, H1, a second height, H2, and a third height, H3, that may each comprise any desirable dimension including, but not limited to 0.40", 0.50", 0.75", 0.031", 0.25", and 0.281", respectively. Specific details and other aspects of the relief cut 108 that permit the flexible attachment and repositioning of the WMS 100 is described below in greater detail.

As illustrated in FIG. 9A, the relief cut 108 comprises one or more break-away portions 108a–108c that define the cavity 110 for permitting removable attachment and mounting of the WMS 100 about the mounting stud 112. Each break-away portion 108a–108c comprises an outer arc portion 120 and a faceted inner wall portion 122, each defining a generally circular outer surface of the break-away portion 108 and a multi-faceted surface that defines the cavity 110, respectively. As illustrated, each of the three break-away portions 108a–108c comprises two inner walls having approximately the same length that defines a generally hexagonal perimeter of the cavity 110. Although each of the three break-away portions 108a–108c include a generally rounded arc portion 120 and two walls comprising the inner wall portion 122 as illustrated, any desirable size, shape, dimension, or amount of the break-away portions 108a–108c may be implemented to execute the function of matingly receiving a head portion 124 (FIGS. 11A and 11B) of the mounting stud 112.

Referring to FIGS. 11A and 11B, the mounting stud 112 generally comprises the head portion 124 and a stinger portion 126. The head portion 124 facilitates attachment of the WMS 100 about the area of the relief cut 108 (FIGS. 12D and 12E) and the stinger portion 126 facilitates attachment of the mounting stud 112 to the PCB 11 (FIGS. 12B–12C). Accordingly, as seen in FIG. 11B, the head portion 124 may include and a multifaceted surface having any desirable amount of surfaces comprising any shape, such as, for example, the illustrated hexagonal shape, that is designed to be matingly received by the cavity 110 (FIG. 9A) to retain the positioning of the WMS 100. Even further, the head portion 124 may also include a threaded passage 125, the functionality of which is described below in greater detail.

It may be desirable to increase the number of surfaces that defines the multifaceted surface of the head portion 124 and the cavity 110 to maximize the amount of pivot positions of the guide members 114. However, a relatively large amount of surfaces (i.e. as the number of surfaces that defines the multifaceted surface approaches infinity) would drive the multifaceted surface to have a relatively non-frictional, circular appearance. A relatively non-frictional, circular appearance of the head portion 124 and the cavity 110 may decrease the anchoring and retaining capability of the WMS 100 about the mounting stud 112, thereby causing the WMS 100 to freely pivot and undesirably adjust the guide members 114 about the head portion 124.

Figure 10:
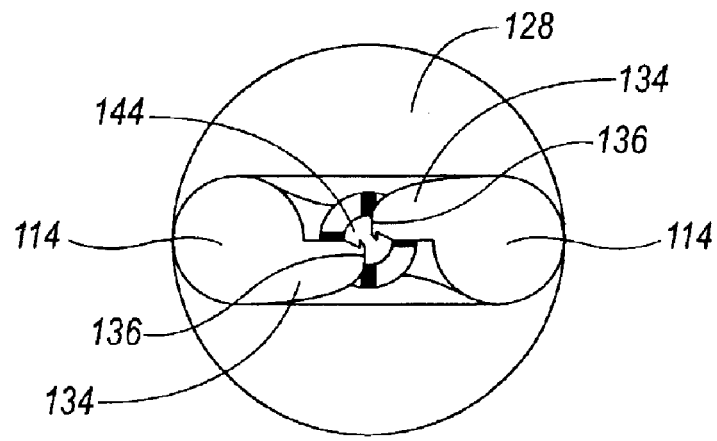
FIG. 10 is a top view of the wire management system according the embodiments illustrated in FIGS. 8A–8C.

In addition to the locking notches 26 in the first embodiment, the upper portion 104 provides a means for suspending wires 13 and/or cabling 15 to minimize the heat build-up from a plurality of heat-emitting devices 17, such as the various components of the PCB 11. As seen in FIGS. 8A and 10, the means for suspending wires 13 and/or cabling 15 includes a base member 128 and a cable locking section 130. The cable locking section 130 includes the locking notches 26 (FIG. 8A) and closing nodes 134 with locking teeth 136 for positively securing the closing nodes 134 together, if desired. Similar to the functionality of the of the locking notches 26 and hoop 36 of the WMS 10, once the wires 13 and/or cabling 15 is received between the guide members 114, the closing nodes 134 with locking teeth 136 may be snapped together to prevent wires 13 and/or cabling 15 from being received between the guide members 114.

Figure 12A:
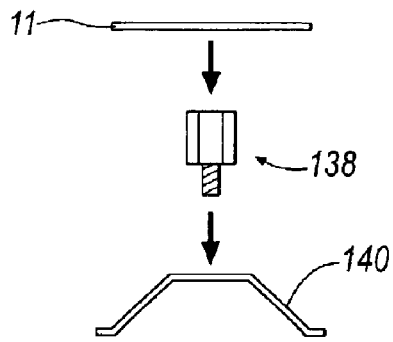
FIGS. 12A–12E show a method for assembling the wire management system of FIGS. 8A–8C.
Figure 12B:
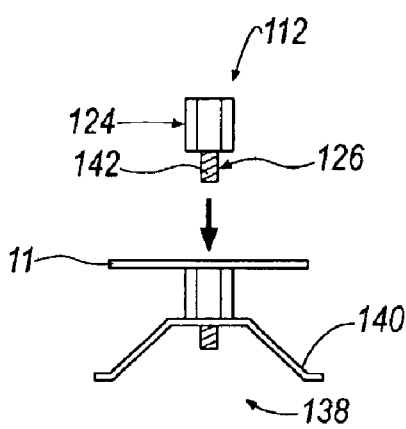
Figure 12C:
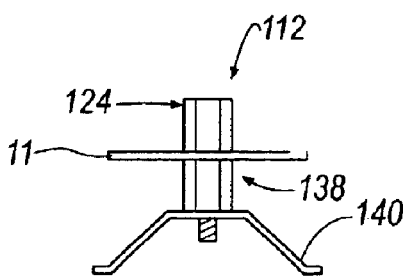
Figure 12D:
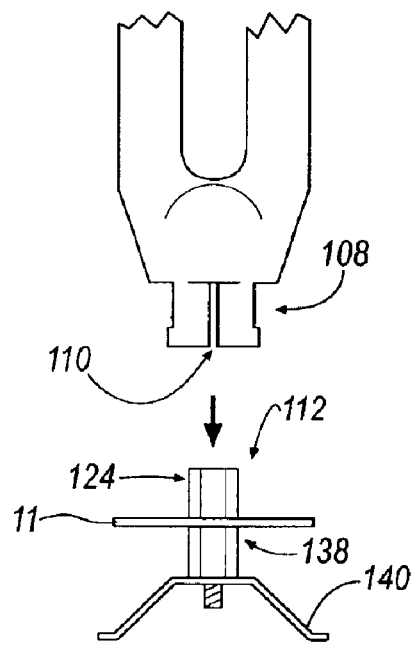
Figure 12E:
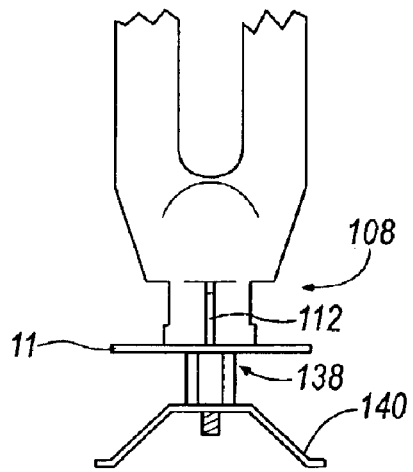

Referring now to FIGS. 12A–12E, an assembly process for mounting the WMS 100 on the PCB 11 will now be described. As shown in FIG. 12A, a second mounting stud, which is generally shown at 138, is first positioned over the PCB 11. If desired, a rigid chassis, such as metal housing 140, may be intermediately located between the PCB 11 and the second mounting stud 138. Alternatively, if desired, the second mounting stud 138 may be positioned under the PCB 11 so that the metal housing 140 may directly oppose the PCB 11 if additional clearance is needed in the metal housing 140. As seen in FIGS. 12B and 12C, the stinger 126 of the first mounting stud 112 may include threads 142 that permit screwing of the mounting stud 112 through the threaded passage 125 of the mounting stud 138 about the PCB 11. Then, as seen in FIGS. 12D and 12E, the cavity 110 is selectively placed about the head portion 124 of the mounting stud 112 to positively secure the WMS 100 to the PCB 11.

Although not illustrated, the stinger 126 and passage 125 may comprise alternative attachment features than the illustrated design depicting threaded surfaces. For example, it is contemplated that the stinger 126 and passage 125 may employ multifaceted surfaces that may matingly cooperate to secure the first mounting stud 112 to the second mounting stud 138 for resisting a pivoting motion of the WMS 100. Alternatively, rather than multifaceted surfaces, the stinger 126 and the passage 125 may comprise a radially-loaded spring stinger (e.g. a banana plug) that exerts radial pressure about the passage in order to prevent vertical or pivoting movement of the WMS 100.

Although not illustrated, it is also contemplated that the mounting stud 112 may be integrally formed into the WMS 100 by any desirable method such as a "two-shot" injection molding process such that the mounting stud 112 is integrally molded within the material comprising the WMS 100. For example, a first shot of molten material may be injected into a mold defining the contour of the WMS 100. Then, the mounting stud 112 may be selectively placed in the mold and a second shot of molten material may be injected into the mold, encapsulating and permanently securing the head portion 124 of the mounting stud 112 within the WMS 100 at or about the area of the base portion 102. Alternatively, the mounting stud 112 may comprise the same material as the WMS 100 and be integrally formed as part of the WMS 100 in a one-shot injection molding process such that the stinger 126 extends from the base portion 102. If the mounting stud 112 is molded in or molded as part of the WMS 100 as described above, the steps of the assembly process as illustrated in FIGS. 12B and 12C may eliminated entirely, thereby reducing the assembly process described above to the steps of positioning the mounting stud 138 over the PCB 11 and attaching the WMS 100 to the PCB 11 and mounting stud 138 as illustrated in FIGS. 12A and 12E, respectively.

Once the WMS 100 is attached to the PCB 11, the guide members 114 may be selectively repositioned, if desired, by perpendicularly lifting and detaching the WMS 100 from the mounting stud 112, rotating the WMS 100 to a desirable position, and placing the WMS 100 over the mounting stud 112. If the WMS 100 cannot be perpendicularly lifted and removed from the mounting stud 112, a user may insert a tool, such as a screwdriver, through an upper portion passage 144 (FIG. 8A) that extends through the base member 128 so that a user may manually contact an upper surface 146 (FIGS. 11A and 11B) of the head portion 124 to unscrew the stinger 126 from the mounting stud 138. Once the WMS 100 with the lodged mounting stud 112 are removed, the user may manually remove the lodged mounting stud 112 from the WMS 100 manually by hand or with a tool, such as a pair of pliers. Alternatively, rather than removing the entire WMS 100 and mounting stud 112, a user may insert a screwdriver through the upper portion passage 144 to provide additional leverage for perpendicularly pulling the WMS 100 away from the mounting stud 112.

Referring now to FIGS. 5B and 9B, another embodiment of the WMS is shown generally at 200. The WMS 200 operates and functions in a similar manner as described above with respect to the WMS 100 and mounting stud 112. In this embodiment of the invention, the WMS 200 includes a relief cut 208 with break-away portions 208a–208c including at least a throat portion 216, a neck portion 218 and a beveled portion 206 that is generally defined by a first diameter, D4, a second diameter, D5, a first height, H4, a second height, H5, and a third height, H6, that may each comprise any desirable dimension including, but not limited to, 0.50", 0.75", 0.031", 0.25", and 0.281", respectively. Essentially, in this embodiment, the first diameter, D4, at a bottom of 220 of the neck portion 218 is the same diameter as that at a bottom-most portion 222 of the beveled portion 206. Because the first diameter, D4, of the WMS 200 is greater than the first diameter, D1, of the WMS 100, the neck portion 218 of the WMS 200 is less tolerant to undesirable loading forces than the neck portion 118 of the WMS 100, during a loading event.

Referring now to FIG. 8C and FIG. 9C, another embodiment of the WMS is shown generally at 300. The WMS 300 operates and functions in a similar manner as described above with respect to the WMS 100 and mounting stud 112. In this embodiment of the invention, the WMS 300 includes a base portion 302 and a beveled portion 306 defined by a diameter, D6, and a height, H7, that may each comprise any desirable dimension including, but not limited to, 0.50" and 0.25", respectively. Essentially, in this embodiment, the base portion 302 does not include a relief cut with break-away notches defined by varying diameters and heights as illustrated in the embodiments of the WMS 100, 200 in FIGS. 8A and 8B, but rather, is supported by a rigid plate or washer 350. In this embodiment, when undesirable loading forces are applied about the WMS 300, the washer 350 assists in the distribution of the loading forces about the base portion 302, away from the PCB 11, so that the mounting stud 112 may break through the base portion 302 of the WMS 300. Although not illustrated, it is contemplated that the base portion 302 may include at least break-away portions to aid the mounting stud 112 in breaking through the material comprising the WMS 300.

Even further, it may be desirable to prevent the WMS 100, 200, 300 to "break away" while also allowing flexible movement about the base portion. More specifically, this may be achieved by implementing a pivoting feature about the base portion that permits each of the WMS 100, 200, 300 to angularly adjust the WMS 100, 200, 300 to any desirable angle ranging from 0° to 180° about the PCB 11.

As described above, the present invention properly manages the position of wires 13 and/or cabling 15 within or external to an enclosure to minimize heat build-up from the plurality of heat-emitting devices 17 within the enclosure. This is accomplished by minimizing the surface area of the wires 13 and/or cabling 15 that is exposed to the heat-emitting devices 17 by positioning the wires 13 and/or cabling 15 in a general vertical orientation with respect to the heat-emitting devices 17. Because the WMS 10, 100, 200, 300 minimizes the heat build-up within the enclosure, the present invention greatly improves equipment life and reliability of the heat-emitting devices 17. Even further, the guide members 24, 114 of the WMS 10, 100, 200, 300 may be rotatably positioned so that the path taken by the wires 13 and/or cabling 15 may be desirably orientated within or about a computer system enclosure.

While the invention has been specifically described in connection with certain specific embodiments thereof, it is to be understood that this is by way of illustration and not of limitation, and the scope of the appended claims should be construed as broadly as the prior art will permit.

What is claimed is:

1. A management system for a cable having a surface area, comprising:
   a mounting stud including a multifaceted bead portion;
   a cable guide assembly including a base portion and an upper portion, wherein the upper portion includes at least two guide members; and
   a multifaceted cavity within the base portion for mounting the cable guide assembly to the multifaceted head portion of the mounting stud, wherein the at least two guide members orientates the cable in such a manner so as to minimize the surface area of the cable that is exposed to a heat emitting device.

2. The system according to claim 1 wherein the multifaceted head portion end the multifaceted cavity include cooperating mating surfaces for mounting the cable guide assembly.

3. The system according to claim 1, wherein the base portion includes a relief cut for supporting the cable guide assembly while permitting the cable guide assembly to snap off during an undesirable loading event.

4. The system according to claim 3, wherein the relief cut includes at least three members each including an outer arc and an inner faceted surface including two walls that define a hexagonal multifaceted cavity for receiving a head portion of the mounting stud including a hexagonal surface.

5. The system according to claim 3, wherein the base portion includes a passage extending through the base member that provides access to the mounting stud after the cable guide assembly has been mounted to the mounting stud.

6. The system according to claim 1, wherein the at least two guide members orientates the cable in a generally vertical direction with respect to the heat emitting device to minimize the surface area of the cable exposed to the heat emitting device.

7. The system according to claim 6, wherein the at least two guide members includes closing nodes that prevent the wires and/or cabling from being received between the guide members.

8. The system according to claim 1, wherein the base portion, the upper portion, and the beveled portion is an integral unit.

9. The system according to claim 8, wherein the mounting stud is formed as part of the integral unit.

10. The system according to claim 8, wherein the mounting stud is integrally formed into the integral unit.

11. A process far assembling a wire managment system, comprising the steps of:
    positioning a first mounting stud including a threaded passage below an opening in an electrical component;
    positioning a stinger of a second mounting stud over the opening and the threaded passage;
    threading the stinger about the threaded passage;
    receiving a base portion with a multifaceted cavity of a cable guide assembly about a multifaceted head portion of the second mounting stud.

12. The process for assembling the cable guide system according to claim 11, further comprising of providing a means for preventing the cable from being receiving between the at least two guide members.

13. A management system for a cable having a surface area, comprising
    a mounting stud including a multifaceted head portion;
    a cable guide assembly mounted to the mounting stud, the cable guide assembly including a base portion and an upper portion, wherein the upper portion includes at least two guide members; and
    a multifaceted cavity within the base portion for mounting the cable guide assembly to the multifaceted head portion of the mounting stud, wherein the at least two guide members orientates the cable in such a manner so as to minimize the surface area of the cable that is exposed to a heat emitting device, wherein the base portion includes a relief cut with at least three members each including an outer arc and an inner faceted surface including two walls that define a hexagonal multifaceted cavity for receiving a head portion of the mounting stud including a hexagonal surface, wherein the relief cut supports the cable guide assembly while permitting the cable guide assembly to snap off during an undesirable loading event.

* * * * *

UNITED STATES PATENT AND TRADEMARK OFFICE
CERTIFICATE OF CORRECTION

PATENT NO. : 6,865,087 B2
DATED : March 8, 2005
INVENTOR(S) : Conrad A. H. Jelinger It is certified that error appears in the above-identified patent and that said Letters Patent is hereby corrected as shown below:

Column 7,
Line 7, change "a mounting stud including a multifaceted bead portion" to -- a mounting stud including a multifaceted head portion --.
Line 18, change "the multifaceted head portion end the multifaceted cavity" to -- the multifaceted head portion and the multifaceted cavity --.

Signed and Sealed this

Seventeenth Day of May, 2005

JON W. DUDAS
*Director of the United States Patent and Trademark Office*